(12) United States Patent
Chiu et al.

(10) Patent No.: US 10,971,425 B2
(45) Date of Patent: Apr. 6, 2021

(54) SEMICONDUCTOR DEVICE

(71) Applicant: Taiwan Semiconductor Manufacturing Co., Ltd., Hsinchu (TW)

(72) Inventors: Chien-Chia Chiu, Taoyuan (TW); Li-Han Hsu, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/373,643

(22) Filed: Apr. 3, 2019

(65) Prior Publication Data

US 2020/0105640 A1    Apr. 2, 2020

Related U.S. Application Data

(60) Provisional application No. 62/737,869, filed on Sep. 27, 2018.

(51) Int. Cl.
| | |
|---|---|
| *H01L 23/40* | (2006.01) |
| *H01L 23/31* | (2006.01) |
| *H01L 23/04* | (2006.01) |
| *H01L 23/16* | (2006.01) |
| *H01L 23/10* | (2006.01) |

(52) U.S. Cl.
CPC .............. *H01L 23/40* (2013.01); *H01L 23/04* (2013.01); *H01L 23/16* (2013.01); *H01L 23/3121* (2013.01); *H01L 23/10* (2013.01)

(58) Field of Classification Search
CPC .................................................. H01L 23/562
See application file for complete search history.

(56) References Cited

U.S. PATENT DOCUMENTS

| | | | |
|---|---|---|---|
| 2008/0151353 A1* | 6/2008 | Haskett ................. | B81B 7/0077 359/291 |
| 2018/0261528 A1* | 9/2018 | Chen ...................... | H01L 23/16 |
| 2018/0261554 A1* | 9/2018 | Huang .................. | H01L 23/562 |

* cited by examiner

*Primary Examiner* — Fernando L Toledo
*Assistant Examiner* — Valerie N Newton
(74) *Attorney, Agent, or Firm* — JCIPRNET

(57) ABSTRACT

A semiconductor device including a circuit substrate, a chip package, and a stiffener ring is provided. The chip package is disposed on and electrically connected to the circuit substrate, the chip package includes a pair of first parallel sides and a pair of second parallel sides shorter than the pair of first parallel sides. The stiffener ring is disposed on the circuit substrate, the stiffener ring includes first stiffener portions extending along a direction substantially parallel with the pair of first parallel sides and second stiffener portions extending along the direction substantially parallel with the pair of second parallel sides. The first stiffener portions are connected to the second stiffener portions, and the second stiffener portions is mechanically weaker than the first stiffener portions. A semiconductor device including stiffener lids is also provided.

20 Claims, 16 Drawing Sheets

SEMICONDUCTOR DEVICE

CROSS-REFERENCE TO RELATED APPLICATION

This application claims the priority benefit of U.S. provisional application Ser. No. 62/737,869, filed on Sep. 27, 2018. The entirety of the above-mentioned patent application is hereby incorporated by reference herein and made a part of this specification.

BACKGROUND

In packaging of semiconductor devices, after individual semiconductor dies are manufactured and packaged, the packaged semiconductor die may be mounted on a packaging substrate with other electronic components, such as other semiconductor dies, to form a semiconductor device. The semiconductor device having multiple semiconductor dies mounted thereon are then bonded to a printed circuit board (PCB) through a thermal process. Warpage and stress may occur during the thermal process due to the mismatch in Coefficients of Thermal Expansion (CTEs) between different materials and different package components, such as different material between the packaging substrate and the semiconductor dies. The warpage may lead to shorting between connectors of the package substrate and/or open circuit between the connectors and the PCB. It is desired to reduce the warpage of the semiconductor device when bonding to a PCB.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
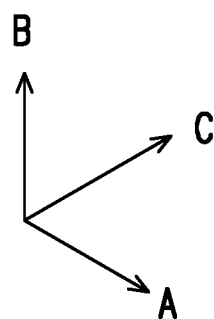
FIG. 1A illustrates perspective view of a semiconductor device in accordance with some embodiments.
Figure 1A:
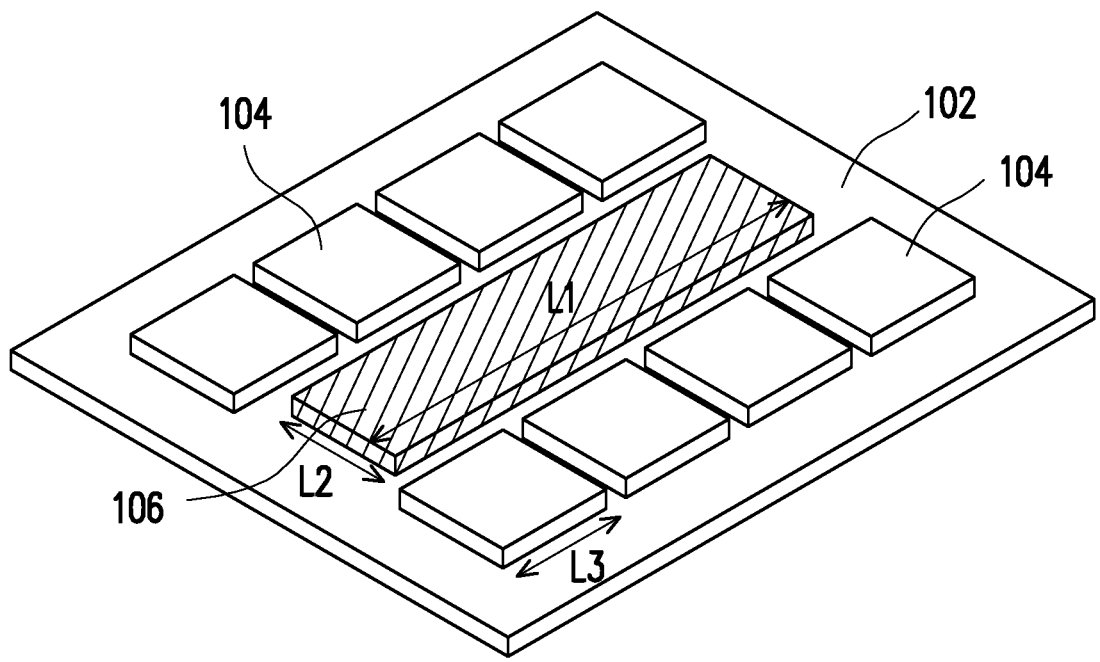

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor industry, various chip packages or electronic components may be mounted on a packaging circuit substrate to form a semiconductor device. The semiconductor device may then be bonded to a printed circuit board (PCB) through a thermal process. Usually, the chip packages and the circuit substrate are formed of different materials having mismatched coefficient of thermal expansion (CTE). As a result, the chip packages and circuit substrate experience significantly different dimensional change under temperature change. If uncompensated, the disparity in CTE can result in warpage of the semiconductor device be it under room temperature or during the thermal process while bonding to a PCB.

The effect of mismatch in the CTE is more pronounced with increase in dimension of the chip package, therefore the degree of warpage may be different along different direction. For example, the semiconductor device may be warped to a greater degree along the length direction of the chip package than along the width direction of the chip package. Depending on the mismatch of CTE, the warped semiconductor device may be concave (i.e. middle portion lower than edge portion) or convex (i.e. middle portion higher than edge portion).

FIG. 1A illustrates perspective view of a semiconductor device 100 in accordance with some embodiments. A 3D coordinate axis having mutually orthogonal A, B and C axis are provided for ease of description. Referring to FIG. 1A, semiconductor device 100 includes a circuit substrate 102, chip package 106 and a plurality of electronic components 104. As shown in FIG. 1A, the chip package 106 and the electronic components 104 are disposed on top of the circuit substrate 102. Although not illustrated, in some embodiments, only chip package 106 is provided on the circuit substrate 102 to constitute the semiconductor device 100.

In some embodiments, the circuit substrate 102 may be a ball grid array (BGA) substrate, an interposer or any packaging substrate that may be bonded (e.g. soldered) to a printed circuit board (PCB) through a thermal process (e.g. reflow). In some embodiments, solder balls 602 (shown in FIGS. 8A-8D) may be formed on the bottom surface of the circuit substrate 102 for soldering onto a PCB. In some embodiments, the chip package 106 may be an integrated fan-out (InFO) large scale integration (LSI) package and the electronic components 104 may be memory devices (e.g., memory chips or memory packages). In some embodiment, the chip package 106 may be a central processing unit (CPU), field programmable gate array (FPGA), microcontrollers, and the like. In some embodiment, the electronic components 104 may be memory devices such as high bandwidth memories (HBM), dynamic random access memories (DRAM), static random access memories (SRAM) and the combination thereof. In some alternative embodiments, the electronic components 104 may be a graphical processing unit (GPU) chip, power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In some alternative embodiments, the electronic components 104 may also be passive components (e.g. resistors, inductors, capacitors etc.). In some embodiments, the electronic components 104 may be a combination of any of the above-mentioned candidate in numbers more or less than the number of electronic components 104 shown in FIG. 1A.

Still referring to FIG. 1A, the chip package 106 may have a rectangular shape in a top view (i.e. viewed along B-direction) and have a pair of long parallel sides with length L1 and a pair of short parallel sides with length L2. In some embodiments, the ratio of L1:L2 may be in a range of between about 1:1 to about 7:1. As shown in FIG. 1A, the long parallel sides with length L1 extends along C-direction whereas the pair of short parallel sides with length L2 extends along A-direction. Hereinafter, the C-direction is the reference direction along the pair of long parallel sides of the chip package 106 and the A-direction is the reference direction along the pair of short parallel sides of the chip package 106.

The chip package 106 may be arranged on central region of the circuit substrate 102 and the electronic components 104 may be arranged symmetrically about the chip package 106, such as beside both long sides of the chip package 106 along the C-direction, as shown in FIG. 1A. The electronic components 104 may have a rectangular shape in a top view and a length L3 along the longest sides of the electronic components 104. The length L1 is greater than the length L3. That is, the maximum dimension of the chip package 106 is greater than the maximum dimension of the electronic components 104. In some embodiments, the electronic components 104 and the chip package 106 include bumps 120 (shown in FIG. 6) thereunder, and are bonded to corresponding pads (not shown) on the circuit substrate 102 through a reflow process to create electrical connections in the form of solder joints between the electronic components 104 and the circuit substrate 102 as well as between the chip package 106 and the circuit substrate 102. In some embodiments, the circuit substrate 102 has a CTE greater than the chip package 106 and the chip package 104, resulting in warpage during thermal process. The warpage of semiconductor device 100 will be discussed below with reference to FIGS. 1B and 1C.

Figure 1B:
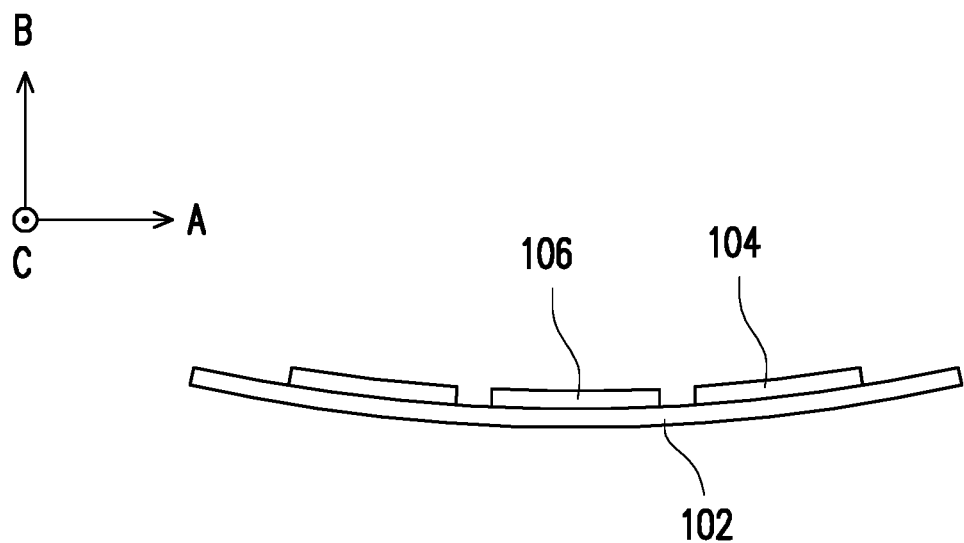
FIGS. 1B and 1C illustrate side views of the semiconductor device of FIG. 1A in accordance with some embodiments.
Figure 1C:
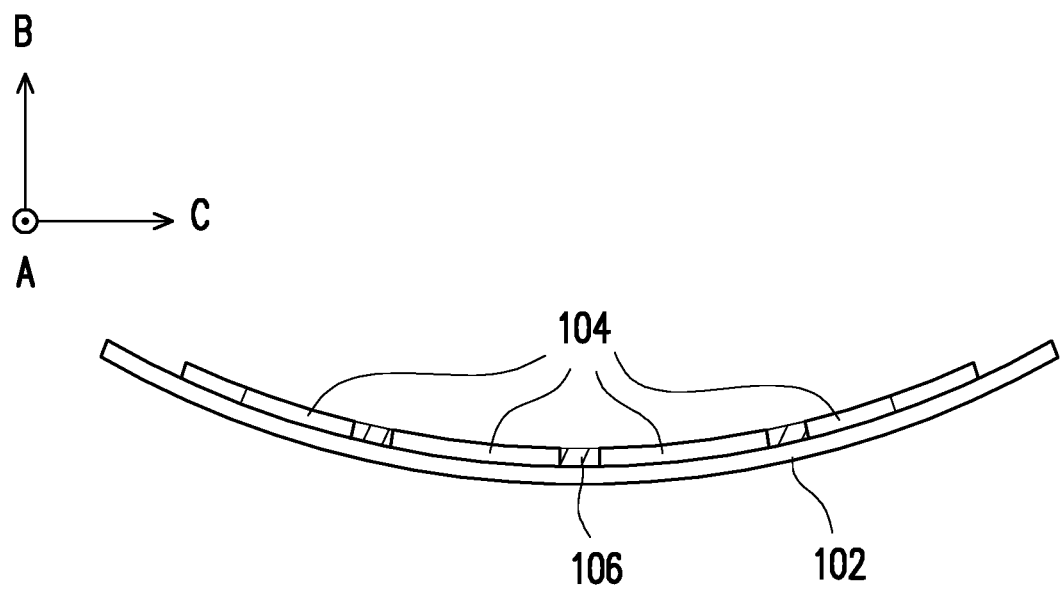

Referring the FIGS. 1B and 1C, side views of a warped semiconductor device 100 during a thermal process are shown. In particular, FIG. 1B shows side view of the semiconductor device 100 from C-direction and FIG. 1C shows side view of the semiconductor device 100 from A-direction. Due to the circuit substrate 102 having CTE greater than the chip package 106 and the chip package 104, four corners of the semiconductor device 100 are warped upwards during thermal process. That is, side views the semiconductor device 100 presents a concave profile.

Although both side views FIGS. 1B and 1C of semiconductor 100 have concave warped profiles, the degree of warpage in FIG. 1C is greater than the degree of warpage in FIG. 1B. As described above, the effect of mismatch in the CTE becomes more pronounced with increase in dimension of the chip package, therefore the degree of warpage may be different along different direction. Accordingly, the chip package 106 having a greater dimension along C-direction result in warpage of the semiconductor device 100 along C-direction being greater than warpage along A-direction. In some embodiments, the degree of warpage is determined by the arc of the warped surface. For example, the arc of the semiconductor device 100 along A-direction in FIG. 1B is more gradual than the arc of the semiconductor device 100 along C-direction in FIG. 1C, therefore, the warpage shown in FIG. 1C is greater than FIG. 1B. In some embodiments, circuit substrate 102 having smaller CTE may be chosen, and other warped profile may result during thermal process of the semiconductor device 100. However, the degree of warpage of the semiconductor device 100 is still the greatest along the C-direction.

To reduce the warpage of semiconductor device 100, stiffener structure may be employed to compensate or suppress the warpage. In some embodiment, the stiffener structure is a structure made from a material such as metal that is placed on the circuit substrate 102 beside the chip package 106 to constrain the circuit substrate 102 in an effort to prevent its warpage or other movement relative to the chip package 106.

Figure 2A:
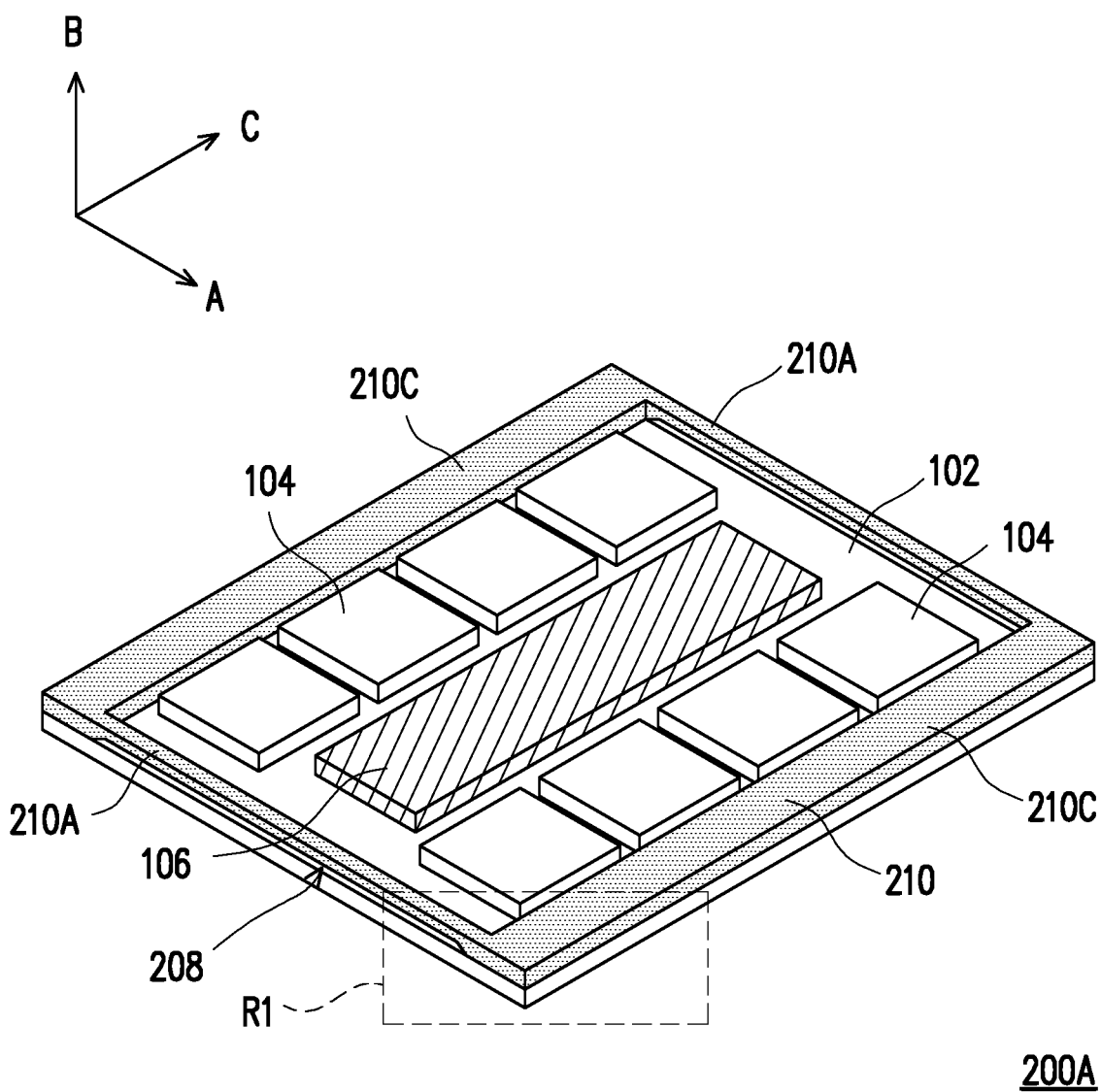
FIG. 2A illustrates perspective view of a semiconductor device with stiffener ring in accordance with an embodiment.

FIGS. 2A, 2C, 3A and 4 illustrate perspective views of various semiconductor devices having various stiffener structures in accordance to various embodiments. Referring to FIG. 2A, a semiconductor device 200A with a stiffener ring 210 as stiffener structure is provided. Other than the presence of stiffener ring 210, the semiconductor device 200A may be similar to semiconductor device 100 discussed with reference to FIG. 1A and details of which are not repeated.

The stiffener ring 210 is a rigid tetragonal ring-like structure extending along the perimeter of the circuit substrate 102 surrounding the chip package 106 and electronic components 104. Two parallel sides 210C of the stiffener ring 210 extends substantially parallel along the C-direction and the other two parallel sides 210A of the stiffener ring 210 extends substantially parallel along the A-direction. The sides 210C of the stiffener ring 210 has a greater structural strength than the sides 210A of the stiffener ring 210, as can be seen from the greater thickness and width shown in FIG. 2A. For ease of description, the sides 210C of the stiffener ring 210 extending along the C-direction will be referred to as "sides 210C", and the sides 210A of the stiffener ring 210 extending along the A-direction will be referred to as "sides 210A" hereinafter. In some embodiments, the structural strength (e.g. stronger or weaker) of the sides herein may refer to the resistance against bending when subjected to external force, with the stronger sides being more resistant to bending than the weaker sides.

Still referring to FIG. 2A, a gap 208 between sides 210A and the top surface of the circuit substrate 102 is present due to the reduced thickness of sides 210A. The stiffener ring 210 will be discussed in greater detail with reference to FIG. 2B which illustrates enlarged view of the region R1 of the semiconductor device 200A.

Figure 2B:
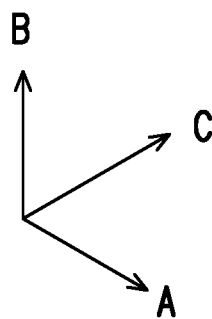
FIG. 2B illustrates enlarged view of the semiconductor device with stiffener ring of FIG. 2A.
Figure 2B:
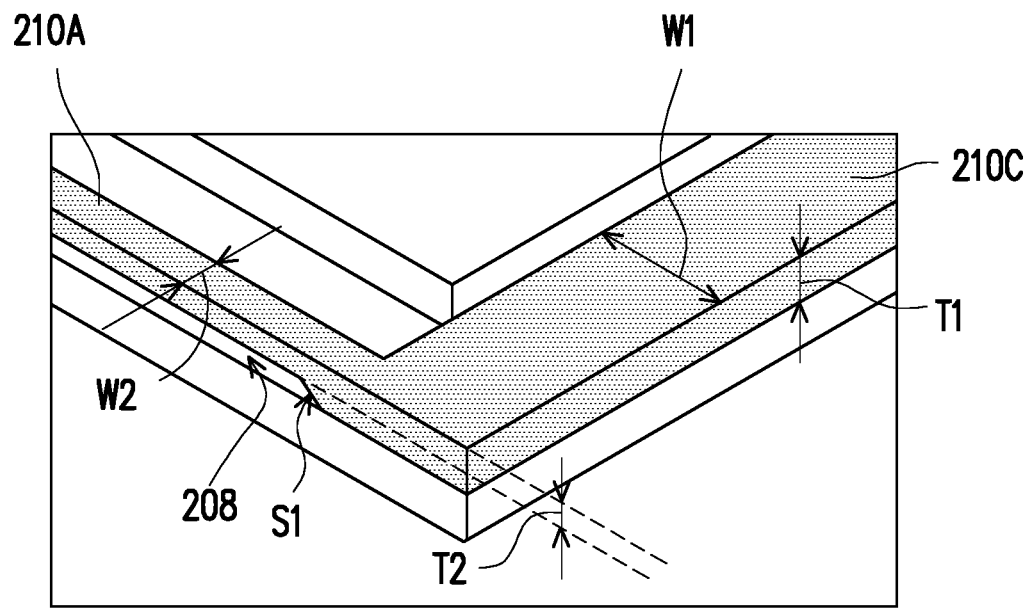

Referring to FIG. 2B, each of the sides 210C has a width W1 and a thickness T1 while each of the sides 210A has a width W2 and thickness T2. In some embodiments, the thickness T1 may be between about 0.5 to about 5 times the thickness of the chip package 106. In FIG. 2B, the width W2 and thickness T2 is smaller than width W1 and thickness T1 respectively. As shown in FIG. 2B, a portion of the weaker sides 210A of the stiffener ring has a tapered surface S1 extending from the bottommost surface of the stiffener ring 210 upwards to reduce the thickness from T1 to T2 and define the gap 208 between sides 210A and the top surface of the circuit substrate 102. In some embodiments, the thickness T2 of the sides 210A is reduced from thickness T1 by having the tapered surface S1 substantially perpendicular to the top surface of circuit substrate 102.

Figure 2C:
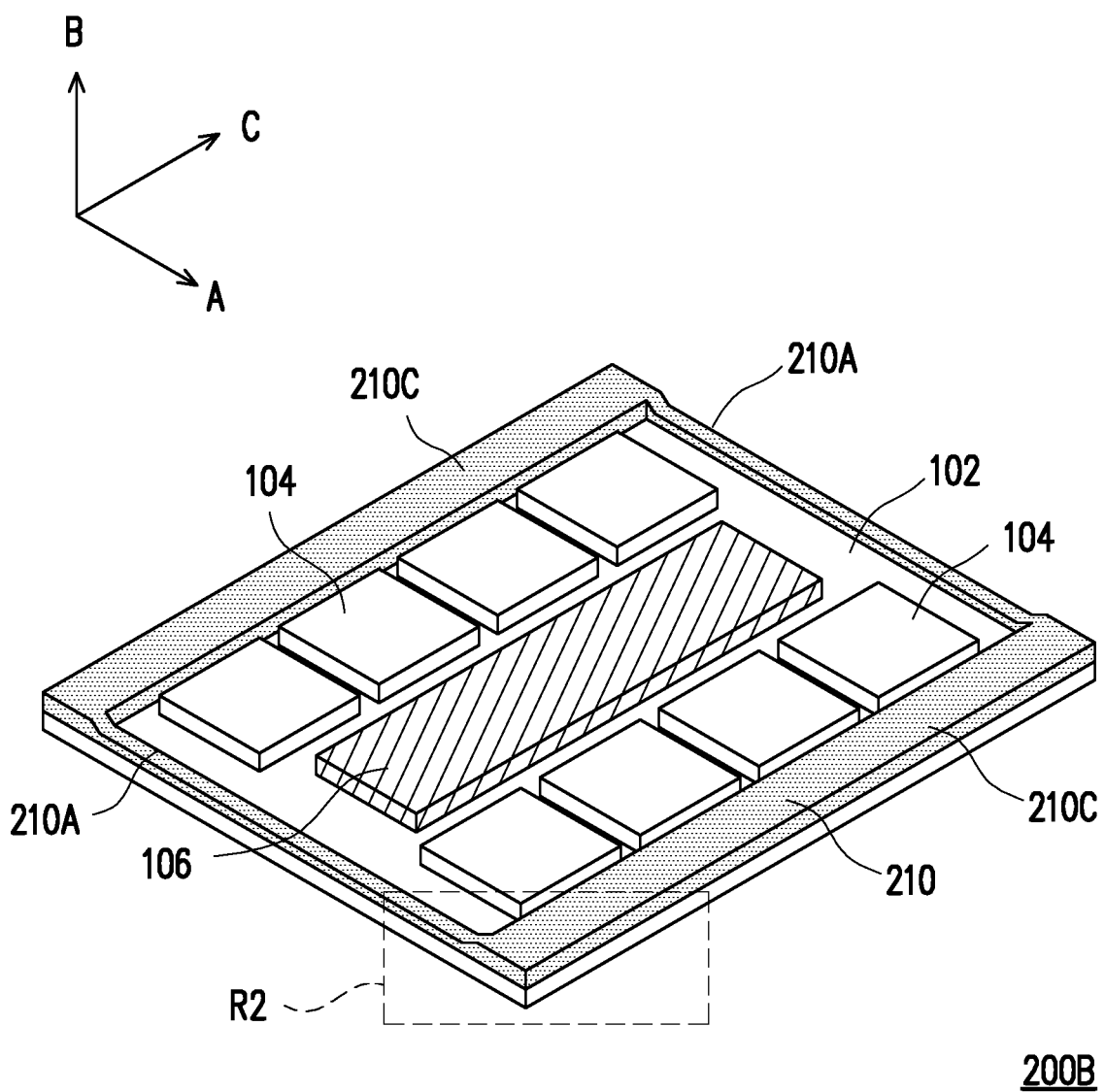
FIG. 2C illustrates perspective view of another semiconductor device with stiffener ring in accordance with an embodiment.
Figure 2D:
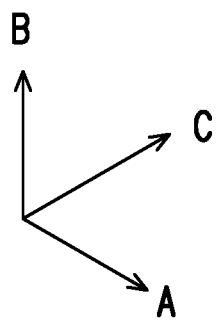
FIG. 2D illustrates enlarged view of the semiconductor device with stiffener ring of FIG. 2C.
Figure 2D:
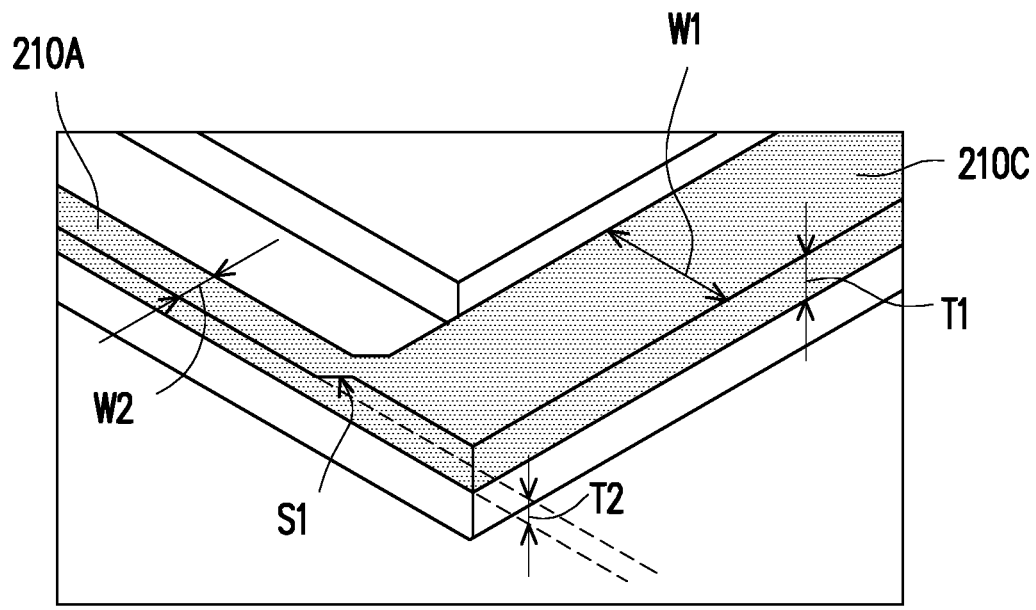

In some embodiment, the stiffener ring 210 shown in FIG. 2A may be flipped such that the top planar surface of the stiffener ring 210 contacts the circuit substrate 102 and no gap is present between the stiffener ring 210 and the circuit substrate 102, as shown in semiconductor 200B of FIG. 2C. In FIG. 2D, showing enlarged view of the region R2 of semiconductor 200B of FIG. 2C, the tapered surface S1 extends from the topmost surface of the stiffener ring 210 downwards to reduce the thickness from T1 to T2.

Figure 2E:
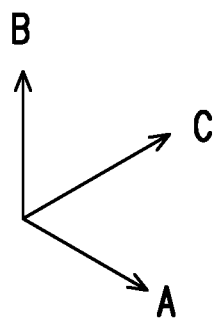
FIG. 2E illustrates enlarged view of yet another semiconductor device with stiffener ring in accordance with an embodiment.
Figure 2E:
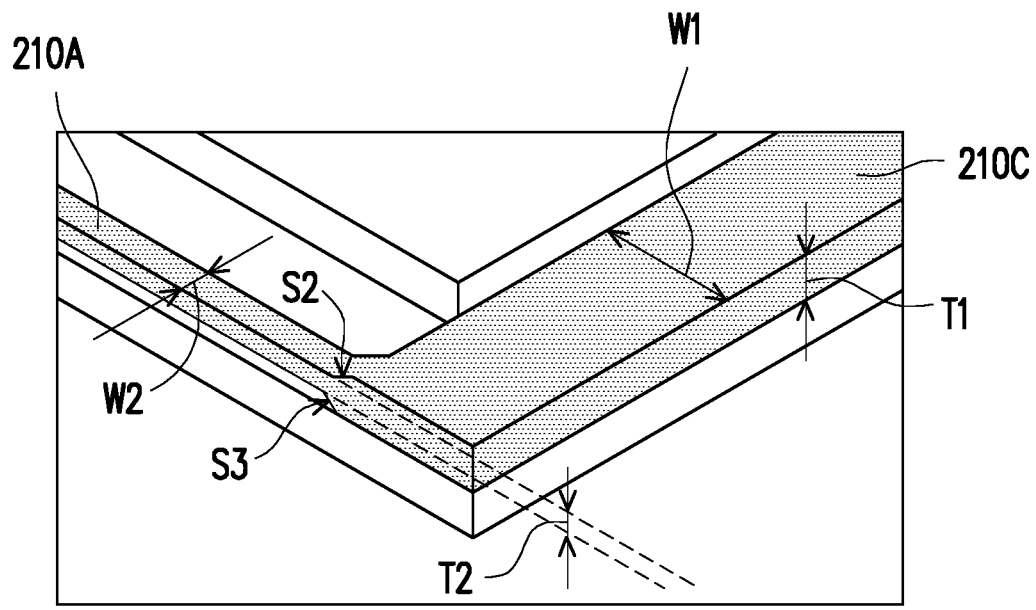

In some alternative embodiments, a semiconductor device with stiffener ring may have the enlarge view of region R3 shown in FIG. 2E. The region R3 may be a region of the semiconductor device similar to region R1 of FIG. 2A. In FIG. 2E, sides 210a may have two tapered surfaces S2 and S3 on each end, with the tapered surface S2 extending from the bottommost surface of the stiffener ring 210 upwards and the tapered surface S3 extending from the topmost surface of the stiffener ring 210 downwards, to achieve the reduced thickness T2.

In some embodiments, the ratio W1:W2 may be in the range of between about 1:1 to about 6:1 and the ratio T1:T2 may be in the range of between about 1:1 to about 10:1. In some embodiment, width W1 is equal to width W2 and thickness T1 is greater than thickness T2. In some embodiment, width W1 is greater than width W2 and thickness T1 is equal to thickness T2. In some embodiment, the sides 210A may have any combination of width W2 and thickness T2 such that the structural strength is between about 20% to about 80% of the sides 210C. In some alternative embodiments, the stiffener ring 210 may be other annular structure that has two opposing sides extending along C-direction and two opposing sides extending along A-direction. In some embodiments, the stiffener ring 210 is attached to the circuit substrate 102 through adhesives such as thermoset polymer or the like. In some embodiments, the adhesive fills the gap 208 between the sides 210A and the top of circuit substrate 102. In some other embodiments, the gap 208 is free from adhesive. In some embodiments, the stiffener ring 210 may be provided on the bottom surface of the circuit substrate 102 surrounding the solder balls 602, such as stiffener structure 810 shown in FIG. 8D.

To reduce warpage in the semiconductor device, the stiffener ring 210 may be made of materials such as copper, stainless steel, or any other rigid materials with the appropriate CTE that may suppress or control the warpage of the semiconductor device. For example, if the circuit substrate 102 has a CTE greater than the chip package 106 and electronic components 104, the stiffener ring 210 may then be chosen to have a CTE that is greater than the CTE of circuit substrate 102. Therefore, when the circuit substrate 102 has a tendency to be warped in manner illustrated in FIGS. 1B and 1C during a thermal process, the stiffener ring 210 having greater CTE than the circuit substrate 102 will have a tendency to be warped in a manner opposite to FIGS. 1B and 1C. The stiffener ring 210 provides an opposing force to the edges of circuit substrate 102 to suppress the warpage of circuit substrate 102. In other words, the stiffener ring 210 provided with an appropriate CTE compensates for the CTE mismatch between the circuit substrate 102 and chip package 106 and electronic components 104 mounted thereon.

As described above, the stiffener ring 210 is provided with stronger sides 210C and weaker sides 210A. The stronger sides 210C is provided to compensate the stronger effect of CTE mismatch along the length L1 of the chip package 106 with the circuit substrate 102, while the weaker sides 210A is provided to compensate the weaker effect of CTE mismatch along the length L2 of the chip package 106 with the circuit substrate 102. As a result, the overall warpage of semiconductor device may be mitigated.

By providing sides 210A being weaker than sides 210C, over-compensation of CTE mismatch along A-direction may be avoided. Particularly, if the sides 210A have equal or greater structural strength than sides 210C, the unnecessarily large CTE mismatch between sides 210A and circuit substrate 102 may cause sides 210A to be warped in a manner opposite (e.g. convex) to FIG. 1B and affecting the bonding of semiconductor device to a PCB.

Figure 3A:
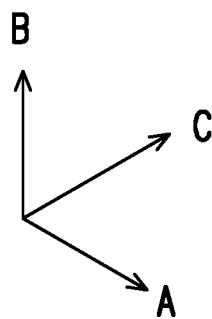
FIG. 3A illustrates perspective view of a semiconductor device with stiffener lids in accordance with another embodiment.
Figure 3A:
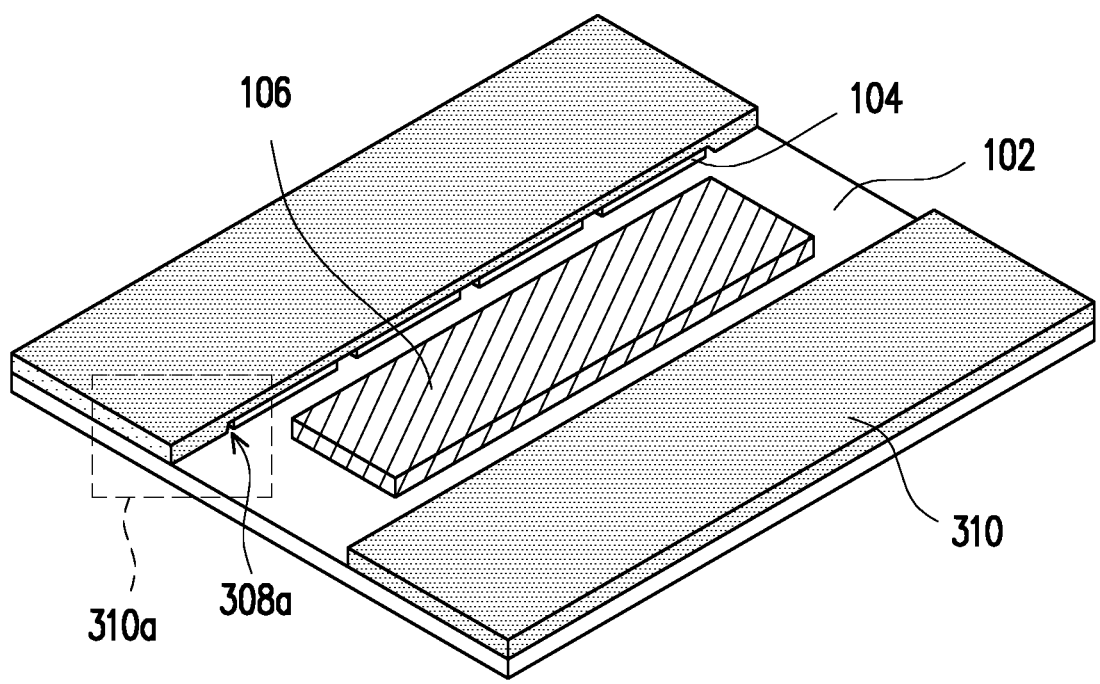
Figure 3B:
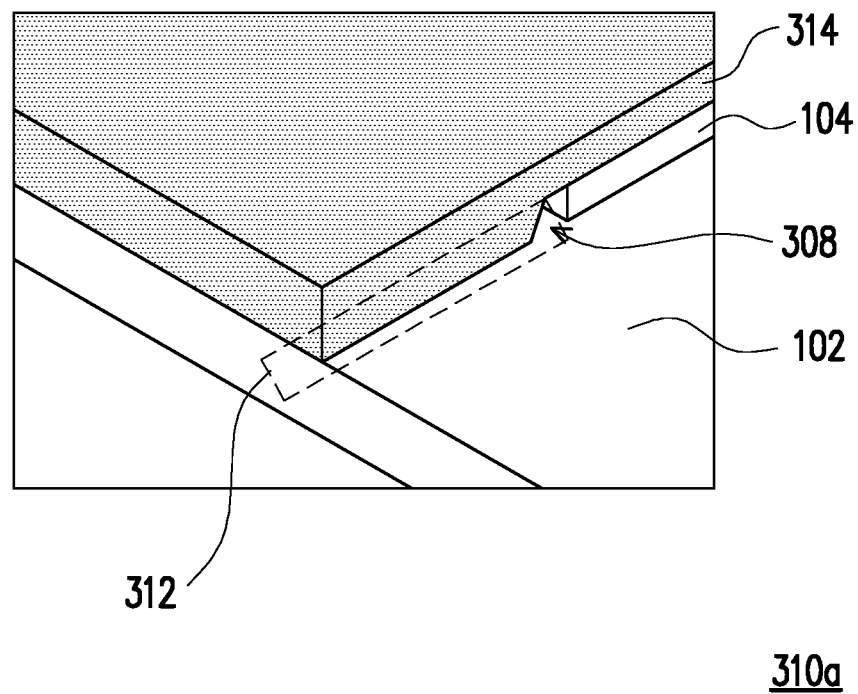
FIG. 3B illustrates enlarged view of the semiconductor device with stiffener lids of FIG. 3A.

Referring to FIG. 3A, a semiconductor device 300 having a pair of stiffener lids 310 as stiffener structure is provided. Other than the presence of the pair of stiffener lids 310, the semiconductor device 300 may be similar to semiconductor device 100 discussed with reference to FIG. 1A and details of which are not repeated. FIG. 3B illustrates enlarged view of the region 310a of the semiconductor device 300.

Referring to both FIGS. 3A and 3B, the pair of stiffener lids 310 is a rigid integral structure having a foot portion 312 and a cover portion 314 covering over the foot portion 312. Each of the pair of stiffener lids 310 extends from one edge of the circuit substrate 102 to the opposite edge of the circuit substrate 102 along the C-direction. The pair of stiffener lids 310 are provided on both sides of the chip package 106 and are separated in the A-direction. The separation of stiffener lids 310 completely exposes the chip package 106, for example. The foot portion 312 is an open frame that extends along the perimeter region of the circuit substrate 102. The cover portion 314 is a plane structure that covers the foot portion 312. The cover portion 314, the foot portion 312 and the circuit substrate 102 together defines a space 308. Electronic components 104 are located in the space 308 and covered by the cover portion 314.

In some embodiments, the foot portion 312 has a height substantially identical to the thickness of the electronic components 104 and the cover portion 314 is in contact with the top surfaces of the electronic components 104. In some embodiments, the foot portion 312 has a height greater than the thickness of the electronic components 104 and a gap is formed between the cover portion 314 and top surfaces of the electronic components 104. In some embodiments, the surface of the foot portion 312 facing electronic component 104 is tapered. In some embodiment, the separation of stiffener lids 310 partially exposes the chip package 106. In some embodiments, the foot portion 312 and the cover portion 314 are not integrally formed and are adhered together using adhesive. In some embodiments, the stiffener lids 310 may be formed of a material having a suitable CTE to compensate the CTE mismatch between the circuit substrate 102 and chip package 106 and electronic components 104 mounted thereon. The material of the stiffener lids 310 may be similar to the stiffener ring 210 as discussed above and is not repeated herein. In some embodiment, the electronic components 104 are partially covered by the cover portion 314. In some embodiments, the stiffener lids 310 is attached to the circuit substrate 102 through adhesives such as thermoset polymer or the like.

By providing the pair of stiffener lids 310 that each extends along C-direction and are separated in the A-direction, the stiffener lids 310 may effectively compensate the stronger effect of CTE mismatch along C-direction and the weaker effect of CTE mismatch along A-direction. At the same time, due to the gap between the pair of stiffener lids 310, the overall strength of the pair of stiffener lids 310 is weaker along the A-direction compared to the strength along the C-direction. Hence, over-compensation of CTE mismatch along A-direction may be avoided.

Figure 4:
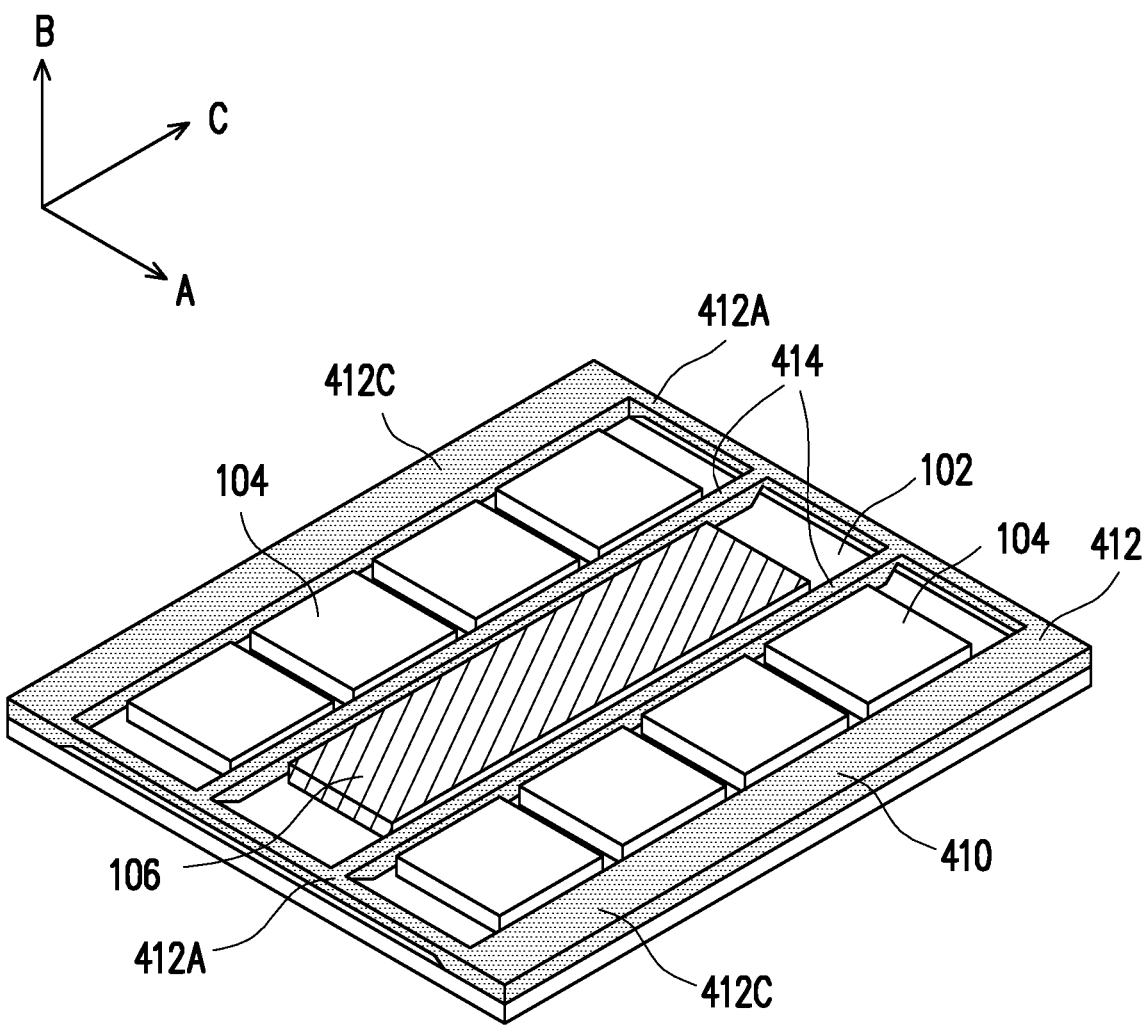
FIG. 4 illustrates perspective view of a semiconductor device with stiffener frame in accordance with another embodiment.

Referring to FIG. 4, a semiconductor device 400 with a stiffener frame 410 as stiffener structure is provided. Other than the presence of stiffener frame 410, the semiconductor device 400 may be similar to semiconductor device 100 discussed with respect to FIG. 1A and details of which are not repeated.

In FIG. 4, the stiffener frame 410 is a rigid structure including a tetragonal ring portion 412 and a pair of ribs 414 formed integrally. The ring portion 412 shown in FIG. 4 includes a pair of sides 412C that extends along C-direction and a pair of sides 412A that extends along A-direction. Further, the pair of ribs 414 extends from one of the sides 412A to the other of sides 412A along the C-direction. The pair of ribs 414 are disposed on both sides of the chip package 106 and extend through the spacing formed between the electronic components 104 and the chip package 106. In some embodiment, the sides 412C and 412A may be similar to the sides 210C and sides 210A of stiffener ring 210, respectively, in term of structural strength. That is, the sides 412A may be designed to have width and/or thickness small than the sides 412C, making sides 412A weaker than sides 412C. In some embodiments, the pair of ribs 414 may have a thickness equal to sides 412C. In some embodiments, the pair of ribs 414 may have ends tapered to the thickness of sides 412A when sides 412A have a thickness smaller than the pair of ribs 414. In some embodiments, the pair of ribs 414 may have a thickness smaller than sides 412C, and a gap may or may not be present between the ribs 414 and the circuit substrate 102. Various embodiments of stiffener frame having ring portion and a pair of ribs extending across the ring portion in the C-direction will be discussed in detail below with reference to FIGS. 5A through 5G.

In some embodiment, the stiffener frame 410 is attached to the circuit substrate 102 through adhesives such as thermoset polymer or the like. In some embodiments, the stiffener frame 410 may be formed of a material having a suitable CTE to compensate the CTE mismatch between the circuit substrate 102 and chip package 106 and electronic components 104 mounted thereon. The material of the stiffener frame 410 may be similar to the stiffener ring 210 as discussed above and is not repeated herein. In some embodiments, the stiffener frame 410 may have more than 2 ribs extending across the ring portion along C-direction. In some embodiments, the pair of ribs 414 may be bent in the AC-plane (i.e. not straight) when extending generally in the C-direction.

Similar to the stiffener ring 210 discussed above with reference to FIG. 2A, the stiffener frame 410 is structurally weaker along A-direction than along C-direction. The stiffener frame 410 may effectively compensate the stronger effect of CTE mismatch along C-direction and the weaker effect of CTE mismatch along A-direction, and over-compensation of CTE mismatch along A-direction may be avoided. Furthermore, by providing the pair of ribs 414 that extends across the ring portion 412 in the C-direction, warpage at the central region (i.e. location of chip package 106) of the semiconductor device 400 along C-direction may be further suppressed and reduced.

FIGS. 5A through 5G illustrate various embodiments of stiffener frame having ring portion and a pair of ribs. In some embodiments, stiffener frame may have a top view of any one of FIGS. 5A through 5D and a side view of any one of FIGS. 5E through 5G.

Figure 5A:
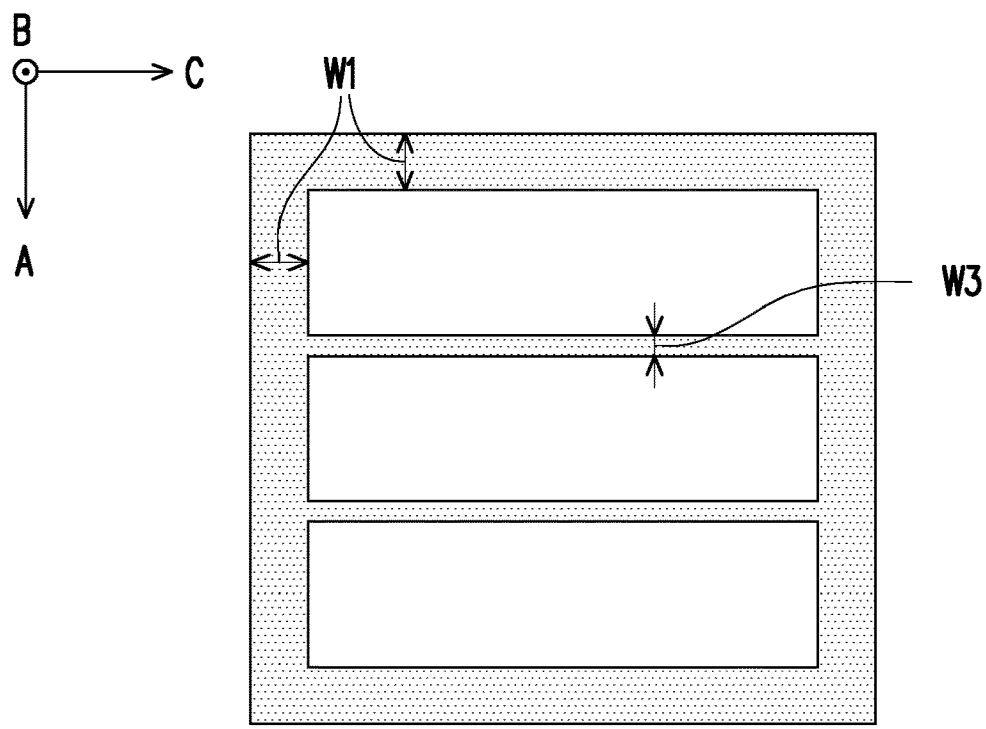
FIGS. 5A through 5D illustrate top views of stiffener frame in accordance with some embodiments.

Referring to FIG. 5A, top view of stiffener frame 410a is provided. The ring portion of the stiffener frame 410a is a tetragonal ring-like structure having equal width W1 on all four sides. The pair of ribs provided in stiffener frame 410a each has a width W3. In some embodiment, the width W3 is equal to the separation distance between chip package 106 and electronic components 104 in the A-direction. In some embodiments, the width W3 is smaller than the separation distance between chip package 106 and electronic components 104 in the A-direction. In some embodiments, the ratio of width W1:W3 is between about 1:6 to about 6:1.

Figure 5B:
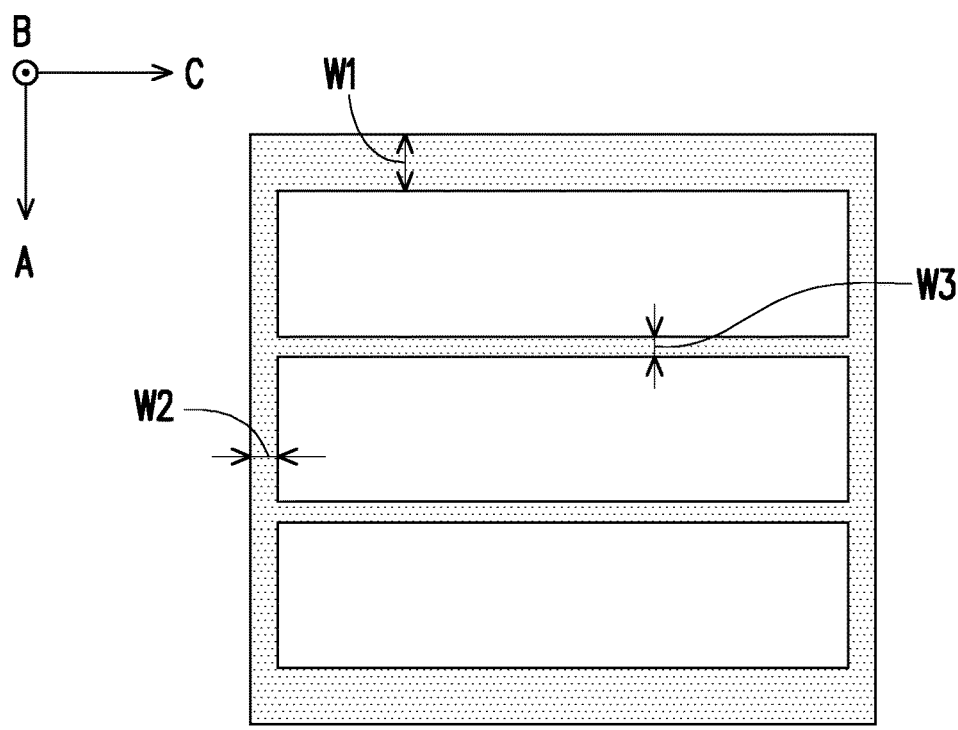

Referring to FIG. 5B, top view of stiffener frame 410b is provided. The difference between the stiffener frame 410b and the stiffener frame 410a of FIG. 5A lies in the width of the ring portion. Particularly, the width of ring portion of the stiffener frame 410b is not equal on all four sides. Ring portion of the stiffener frame 410b has width W1 for the pair of sides that extend in the C-direction and a reduced width W2 for the pair of sides that extend in the A-direction. Dimension of W1 and W2 may be similar to that of stiffener ring 210 discussed above with reference to FIG. 2B and are not repeated.

Figure 5C:
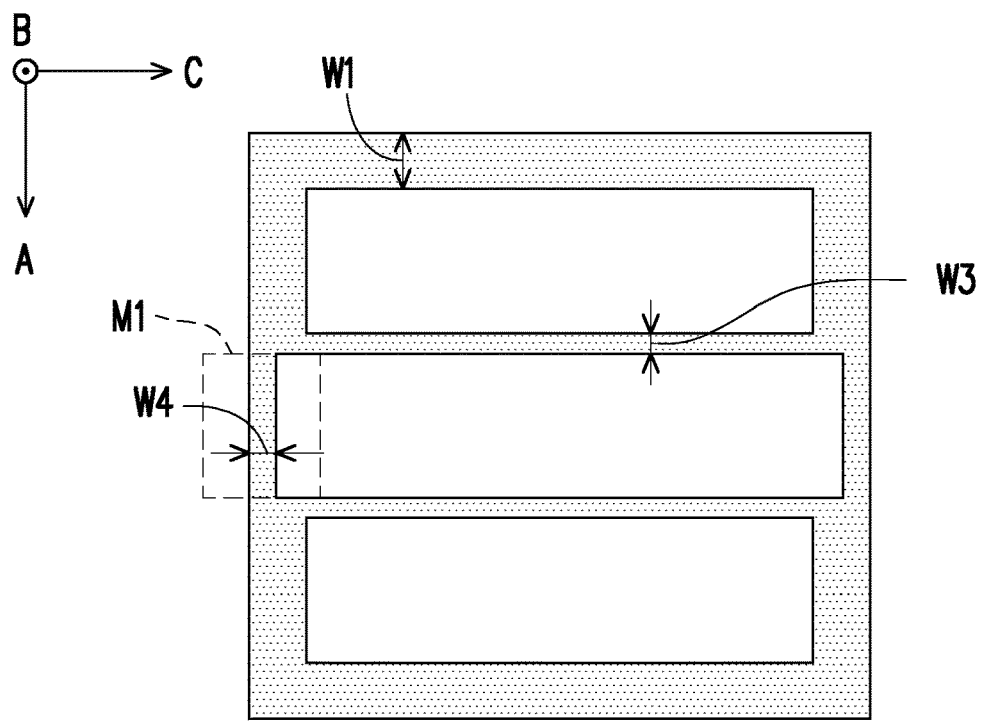

Referring to FIG. 5C, top view of stiffener frame 410c is provided. The difference between the stiffener frame 410c and the stiffener frame 410b of FIG. 5B lies in the shape for the pair of sides that extend in the A-direction of the ring portion. Particularly, the width of the middle part M1 of the pair of sides that extend in the A-direction is reduced to width W4. The middle part M1 is located between the pair of ribs. As shown in FIG. 5C, side surface of the middle part M1 facing the central region of the stiffener frame 410c is receded so that the width W4 is achieved. In some embodiments, the ratio of width W1:W4 is between about 1:2 to about 5:1.

Figure 5D:
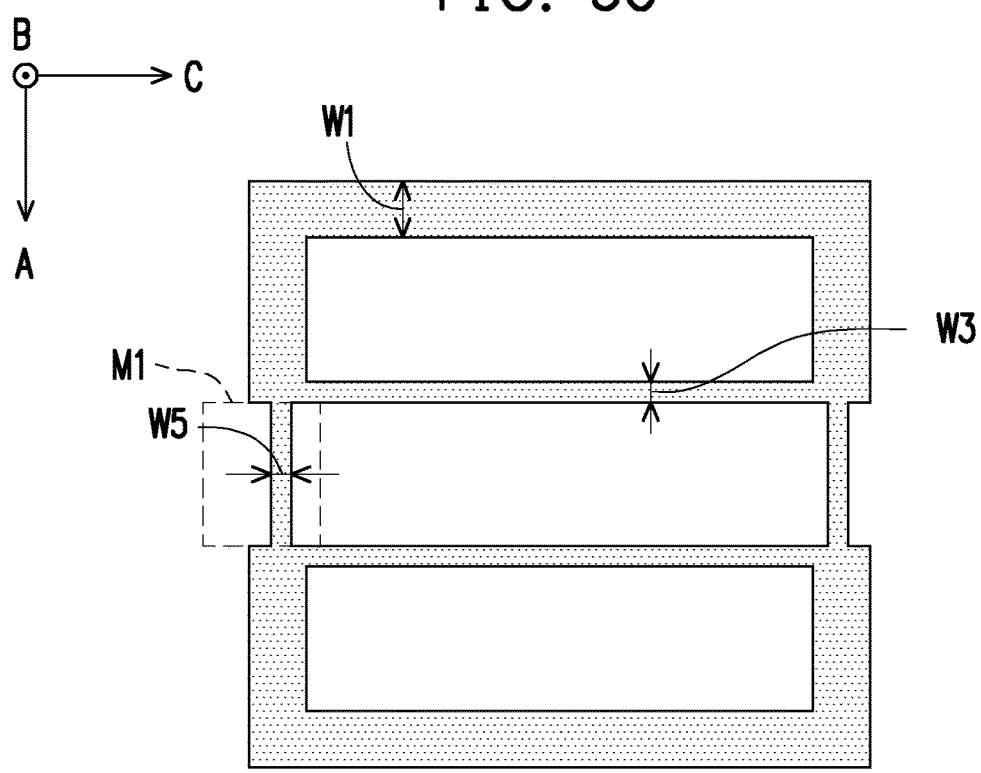

Referring to FIG. 5D, top view of stiffener frame 410d is provided. The difference between the stiffener frame 410d and the stiffener frame 410c of FIG. 5C lies in the shape of the middle portion M1 of the ring portion. Particularly, both side surfaces of the middle part M1 facing toward the central region and away from the central of the stiffener frame 410c is receded so that the width W5 is achieved. In some embodiments, the ratio of width W1:W5 is between about 1:1 to about 5:1.

Figure 5E:
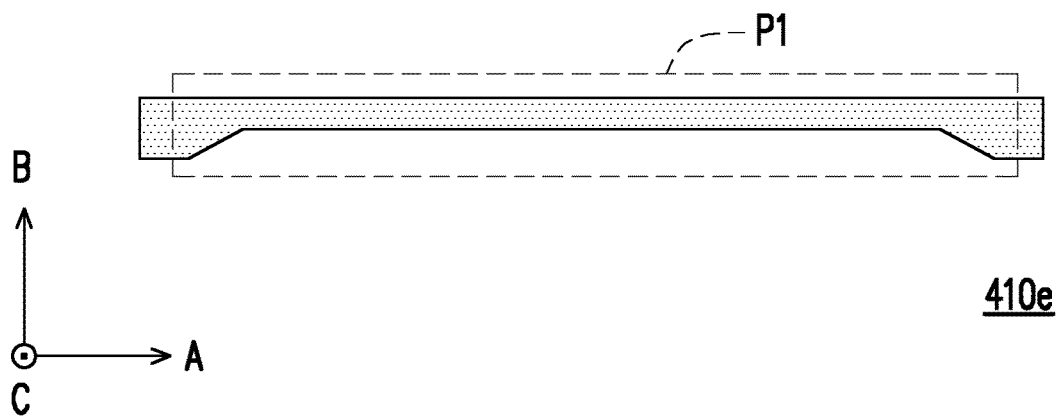
FIGS. 5E through 5G illustrate side views of stiffener frame in accordance with some embodiments.
Figure 5F:
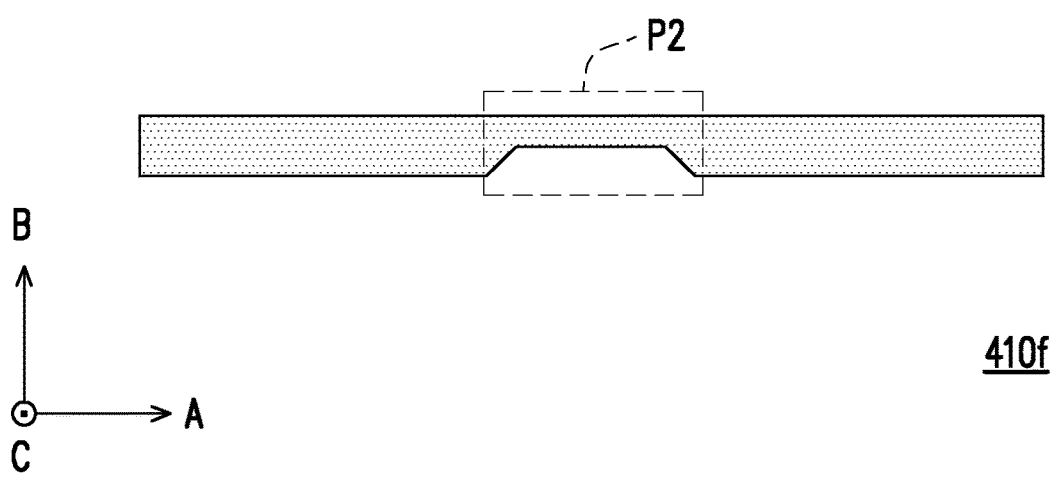
Figure 5G:
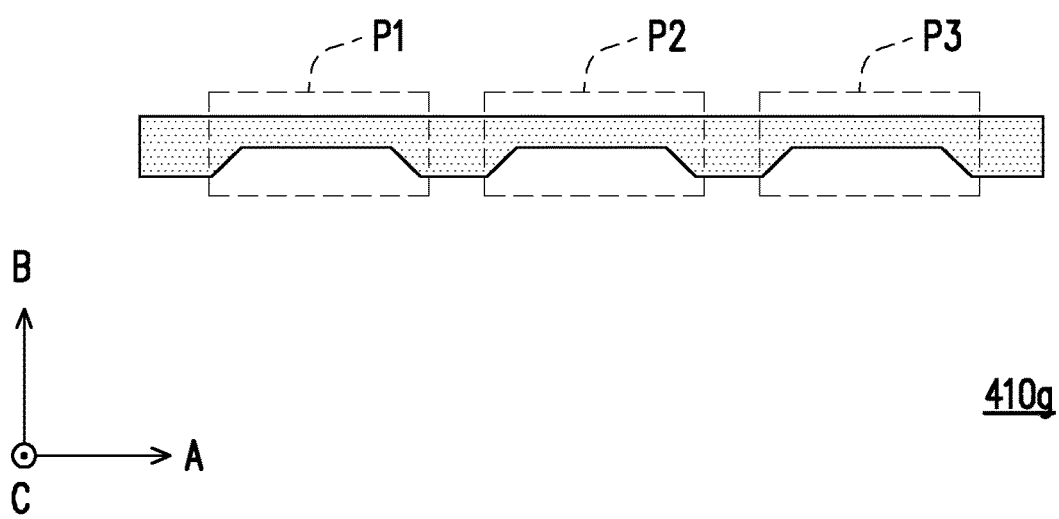

Referring to FIGS. 5E through 5G, side views showing variation in the thickness of the pair of sides of the stiffener frame that extend in the A-direction are provided. In stiffener frame 410e of FIG. 5E, the thickness of the sides is reduced at a portion P1 of the sides. The portion P1 is the portion of sides 412A that connects the pair of sides 412C referring to FIG. 4. In stiffener frame 410f of FIG. 5F, the thickness of the sides is reduced at a portion P2 of the sides. The portion P2 is the portion of sides 412A that connects the pair of ribs 414 referring to FIG. 4. In some embodiment, the portion P2 may correspond to the middle part M1 of the stiffener frame 410c and 410d discussed above with reference to FIGS. 5C and 5D. In stiffener frame 410g of FIG. 5G, the thickness of the sides is reduced at a portions P2 and P3 of the sides. The portion P3 is the portions of sides 412A that connects the pair of ribs 414 to the nearest pair of sides 412C referring to FIG. 4.

In some embodiment, the stiffener frame may have a structure corresponding to any top views shown in FIGS. 5A through 5D and any side views shown in FIGS. 5E through 5G. A stiffener frame having combination between any one of FIGS. 5A through 5D and any one of FIGS. 5E through 5G would result in the stiffener frame being stronger along C-direction and weaker along A-direction. Accordingly, the stiffener frame may effectively compensate the stronger effect of CTE mismatch along C-direction and the weaker effect of CTE mismatch along A-direction, while avoiding over-compensation of CTE mismatch along A-direction.

Figure 6:
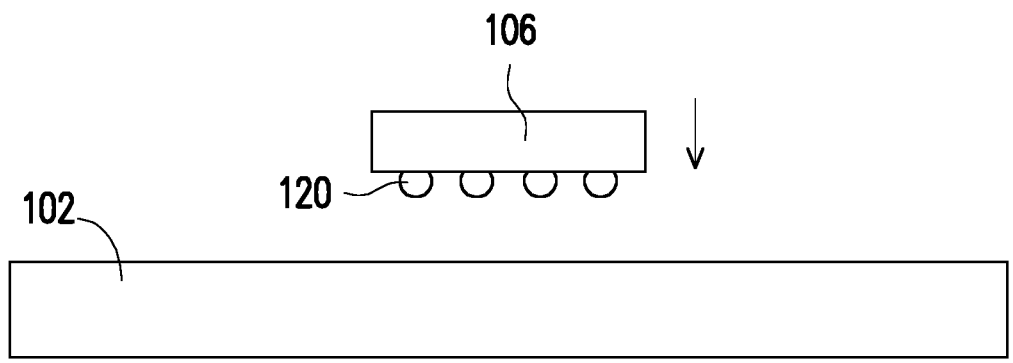
FIGS. 6 through 8D illustrate cross-sectional views of various processing steps during formation of a semiconductor device with stiffener structure in accordance with some embodiments.

FIGS. 6 through 8D illustrate cross-sectional views of various processing steps during formation of a semiconductor device with stiffener structure in accordance with some embodiments. In FIG. 6, a chip package 106 having a plurality of bumps 120 is bonded to the central region of the top surface of a circuit substrate 102. The circuit substrate 102 includes a plurality of pads (not shown) on the top surface of the circuit substrate 102. The bumps 120 may bond to the pads on the top surface of the circuit substrate 102 through a reflow process. After the reflow process, gaps between the chip package 106 and the circuit substrate 102 is filled with underfill 130.

Figure 7:
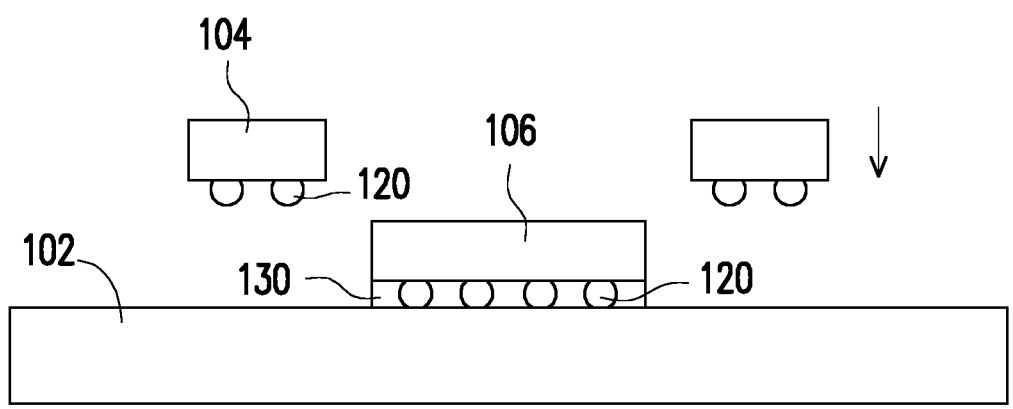

In FIG. 7, after the chip package 106 is bonded to the circuit substrate 102, a plurality of electronic components 104 are then bonded to the circuit substrate 102 around the chip package 106. The electronic components 106 may have bumps 120 and may be bonded to circuit substrate 102 using process similar to bonding of chip package 106. Gaps between the electronic components 104 and the circuit substrate 102 is also filled with underfill 130. In some embodiments, after both chip package 106 and electronic components 104 are bonded to the circuit substrate 102, the semiconductor device 100 of FIG. 1A is formed.

FIGS. 8A through 8D illustrates mounting of different stiffener structures on circuit substrate 102 and forming a plurality of solder balls 602 on the bottom surface of the circuit substrate 102 after the electronic components 104 are mounted. The solder balls 602 electrically connect to pads on the top surface of the circuit substrate 102 through trace wires (not shown) embedded in the circuit substrate 102. The mounting of the stiffener structures may be performed before or after the formation of solder balls 602.

Figure 8A:
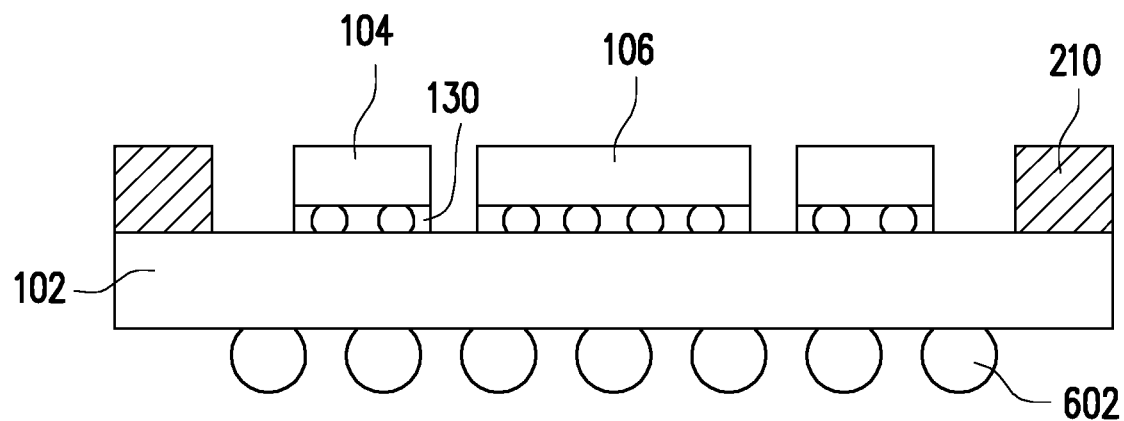
Figure 8B:
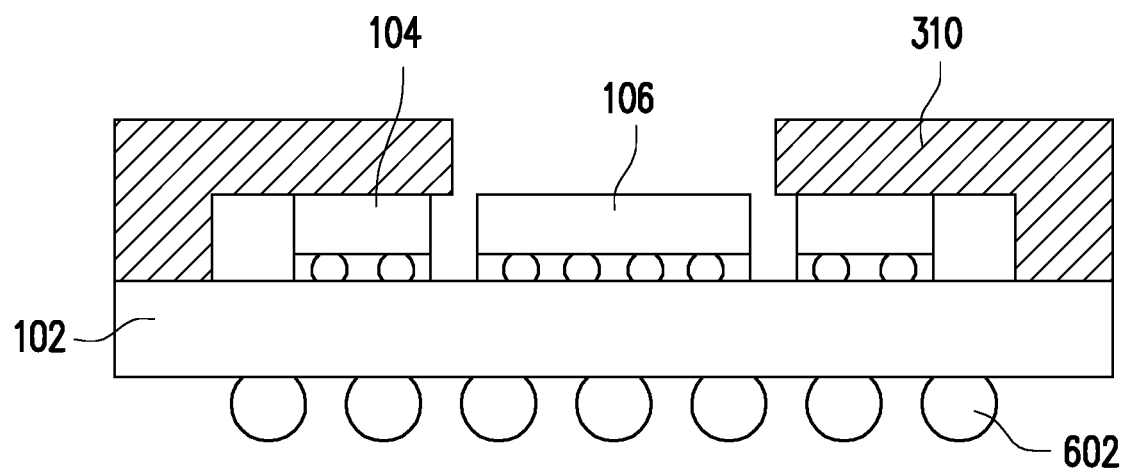
Figure 8C:
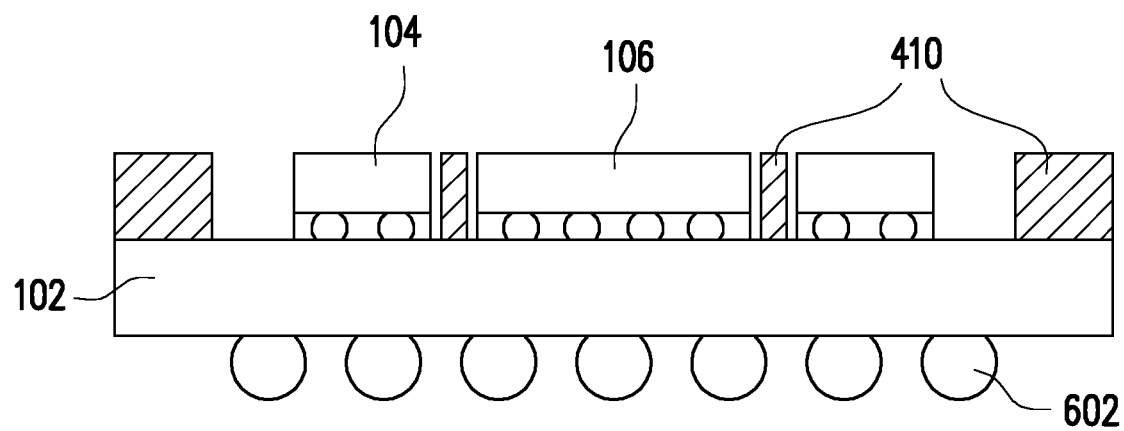
Figure 8D:
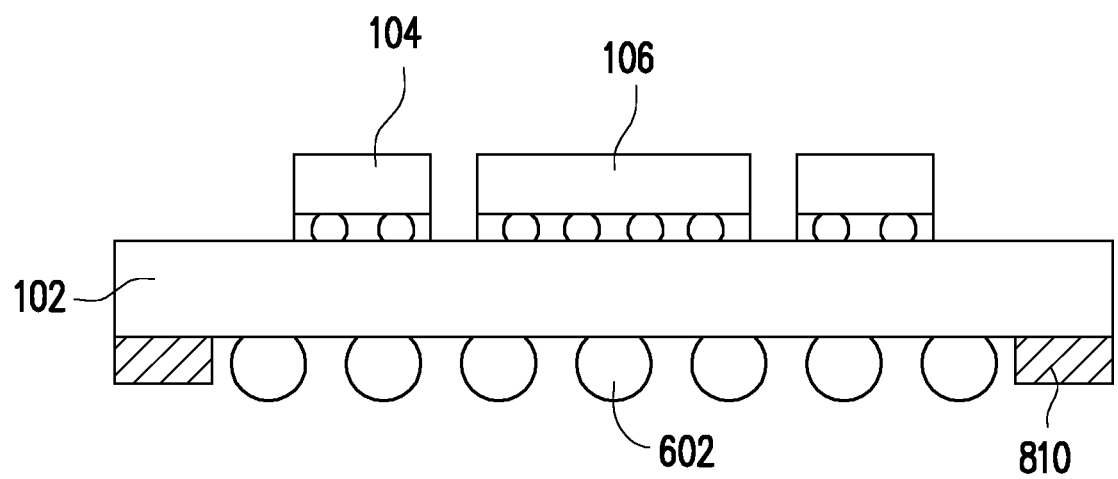

In FIG. 8A, the stiffener ring 210 is mounted on the top surface of the circuit substrate 102 surrounding the chip package 106 and electronic components 104 to form semiconductor device 200A of FIG. 2A. In FIG. 8B, the pair of stiffener lids 310 are mounted on the circuit substrate 102 on opposing sides of the circuit substrate 102 to form semiconductor device 300 of FIG. 3A. In FIG. 8C, the stiffener frame 410 is mounted on the top surface of the circuit substrate 102. The ring portion of the stiffener frame 410 surrounds the chip package 106 and electronic components 104 while the ribs of the stiffener frame 410 is disposed between the separation formed by chip package 106 and electronic components 104, similar to semiconductor device 400 of FIG. 4. In FIG. 8D, a stiffener structure 810 is mounted on the bottom surface of the circuit substrate 102 surrounding the solder balls 602. In some embodiments, the stiffener structure 810 may be a ring structure identical to the stiffener ring 210 of FIG. 2A. In some alternative embodiments, the stiffener structures may be mounted on the circuit substrate 102 before mounting the chip package 106 and electronic components 104.

In accordance with some embodiments of the present disclosure, a semiconductor device includes a circuit substrate; a chip package disposed on and electrically connected to the circuit substrate, wherein the chip package includes a pair of first parallel sides and a pair of second parallel sides shorter than the pair of first parallel sides; and a stiffener ring disposed on the circuit substrate, wherein the stiffener ring includes first stiffener portions extending along a direction substantially parallel with the pair of first parallel sides and second stiffener portions extending along the direction substantially parallel with the pair of second parallel sides, the first stiffener portions are connected to the second stiffener portions, and the second stiffener portions being mechanically weaker than the first stiffener portions.

In accordance with alternative embodiments of the present disclosure, a semiconductor device includes a circuit substrate; a chip package disposed on and electrically connected to the circuit substrate, wherein the chip package includes a pair of first parallel sides and a pair of second parallel sides shorter than the pair of first parallel sides; and a pair of stiffener lids disposed on the circuit substrate, each stiffener lid among the pair of stiffener lids includes a foot portion attached to the circuit substrate and a cover covering the foot portion, the pair of stiffener lids extends along a direction substantially parallel with the pair of first parallel sides and being spaced apart from each other, wherein the foot portion defines a space between the circuit substrate and the cover.

In accordance with alternative embodiments of the present disclosure, a semiconductor device includes a circuit substrate; a chip package disposed on and electrically connected to the circuit substrate, wherein the chip package includes a pair of first parallel sides and a pair of second parallel sides shorter than the pair of first parallel sides; and a stiffener ring disposed on the circuit substrate, wherein the stiffener ring includes a ring body and a plurality of stiffener ribs surrounded by the ring body, wherein the stiffener ribs extend along a direction substantially parallel with the pair of first parallel sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit substrate;

a chip package disposed on and electrically connected to the circuit substrate, the chip package comprising a pair of first parallel sides and a pair of second parallel sides shorter than the pair of first parallel sides; and a stiffener ring disposed on the circuit substrate, the stiffener ring comprising first stiffener portions extending along a first direction substantially parallel with the pair of first parallel sides and second stiffener portions extending along a second direction substantially parallel with the pair of second parallel sides, the first stiffener portions are connected to the second stiffener portions, and the second stiffener portions being mechanically weaker than the first stiffener portions.

2. The semiconductor device as claimed in claim 1, wherein the chip package is surrounded by the stiffener ring.

3. The semiconductor device as claimed in claim 1, wherein the first stiffener portions and the second stiffener portions are substantially identical in thickness and the second stiffener portions are narrower than the first stiffener portions.

4. The semiconductor device as claimed in claim 1, wherein the first stiffener portions and the second stiffener portions are substantially identical in width and the second stiffener portions are thinner than the first stiffener portions.

5. The semiconductor device as claimed in claim 4, wherein the first stiffener portions are adhered with the circuit substrate through an adhesive.

6. The semiconductor device as claimed in claim 5, wherein gaps are between the circuit substrate and the second stiffener portions.

7. The semiconductor device as claimed in claim 4, wherein the first and second stiffener portions are adhered with the circuit substrate through an adhesive.

8. The semiconductor device as claimed in claim 1, wherein the second stiffener portions are thinner and/or narrower than the first stiffener portions.

9. The semiconductor device as claimed in claim 1, wherein the first stiffener portions and the second stiffener portions are different in dimension.

10. The semiconductor device as claimed in claim 1, wherein a first coefficient of thermal expansion (CTE) of the circuit substrate is greater than a second CTE of the chip package.

11. The semiconductor device as claimed in claim 10, wherein a third CTE of the stiffener ring is greater than the first CTE of the circuit substrate.

12. The semiconductor device as claimed in claim 1, wherein the stiffener ring further comprises a plurality of stiffener ribs extending along the first direction substantially parallel with the pair of first parallel sides and connected to the second stiffener portions.

13. The semiconductor device as claimed in claim 12, wherein at least one gap is between at least one of the stiffener ribs and the circuit substrate.

14. A semiconductor device, comprising:

a circuit substrate;

a chip package disposed on and electrically connected to the circuit substrate, the chip package comprising a pair of first parallel sides and a pair of second parallel sides shorter than the pair of first parallel sides; and a pair of stiffener lids disposed on the circuit substrate, each stiffener lid among the pair of stiffener lids comprising a foot portion attached to the circuit substrate and a cover covering the foot portion, the pair of stiffener lids extending along a direction substantially parallel with the pair of first parallel sides and being spaced apart from each other, wherein the foot portion defines a space between the circuit substrate and the cover.

15. The semiconductor device as claimed in claim 14, wherein the chip package is uncovered by the pair of stiffener lids.

16. The semiconductor device as claimed in claim 14 further comprising a plurality of electronic components disposed on and electrically connected to the circuit substrate, wherein the electronic components are located in the space between the circuit substrate and the cover.

17. A semiconductor device, comprising:

a circuit substrate;

a chip package disposed on and electrically connected to the circuit substrate, the chip package comprising a pair of first parallel sides and a pair of second parallel sides shorter than the pair of first parallel sides; and a stiffener ring disposed on the circuit substrate, the stiffener ring comprising a ring body and a plurality of stiffener ribs surrounded by the ring body, wherein the ring body comprises first stiffener portions extending along a first direction substantially parallel with the pair of first parallel sides and second stiffener portions extending along a second direction substantially parallel with the pair of second parallel sides, and the stiffener ribs extend along the first direction substantially parallel with the pair of first parallel sides.

18. The semiconductor device as claimed in claim 17, wherein the second stiffener portions extend beyond lateral extents of the pair of second parallel sides of the chip package.

19. The semiconductor device as claimed in claim 17, wherein a first coefficient of thermal expansion (CTE) of the circuit substrate is greater than a second CTE of the chip package.

20. The semiconductor device as claimed in claim 19, wherein a third CTE of the stiffener ring is greater than the first CTE of the circuit substrate.

* * * * *